United States Patent [19]
Barch et al.

[11] Patent Number: 5,923,836
[45] Date of Patent: *Jul. 13, 1999

[54] TESTING INTEGRATED CIRCUIT DESIGNS ON A COMPUTER SIMULATION USING MODIFIED SERIALIZED SCAN PATTERNS

[75] Inventors: Phillip T. Barch, McKinney, Tex.; Christopher J. Ellingham, Bedford, United Kingdom; Frederick L. Wagner, Garland; John R. Larkin, Spring, both of Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/641,678

[22] Filed: May 1, 1996

Related U.S. Application Data

[63] Continuation of application No. 08/716,382, Jan. 3, 1994, Pat. No. 5,574,853.

[51] Int. Cl.[6] .................................................. G06F 11/263
[52] U.S. Cl. .............................. 395/183.09; 395/183.06; 395/183.13; 371/22.31; 371/22.34; 371/27.4; 364/490; 364/578
[58] Field of Search ..................... 395/183.06, 183.09, 395/183.13, 183.01, 183.08; 371/22.3, 27, 22.4, 22.1, 25.1, 24, 22.31–22.34, 27.4; 364/488–491, 578–580; 324/73.1, 158.1, 537; 702/108, 110, 117, 118, 120, 124, 126

[56] References Cited

U.S. PATENT DOCUMENTS

| | | | |
|---|---|---|---|
| 4,602,210 | 7/1986 | Fasang et al. | 371/22.3 |
| 5,254,942 | 10/1993 | D'Souza et al. | 324/73.1 |
| 5,412,313 | 5/1995 | Martin | 324/158.1 |
| 5,465,259 | 11/1995 | Hanafusa et al. | 371/22.3 |
| 5,535,223 | 7/1996 | Horstmann et al. | 364/489 |
| 5,606,566 | 2/1997 | Whetsel | 702/117 |
| 5,610,826 | 3/1997 | Whetsel | 702/117 |
| 5,657,328 | 8/1997 | Swoboda | 324/73.1 |

*Primary Examiner*—Hal Dodge Wachsman
*Attorney, Agent, or Firm*—W. Daniel Swayze, Jr.; Wade James Brady, III; Richard L. Donaldson

[57] ABSTRACT

A method to test an integrated circuit design on a computer simulation loads a desired simulation test vector in parallel into a scan chain (30). The simulation loads the desired vector at a slight offset or upstream shift allowing several serial shifts of the loaded vector through the scan chain (32). After the serial shifts, the initial IC state is set for executing an IC function (34). The IC function includes applying an input on the external pins and receiving an output from the external pins, given the initial IC state loaded by the simulation After executing the IC function, the simulation unloads the resulting IC state in parallel (36) and compares the resulting IC state to a target vector (38).

11 Claims, 2 Drawing Sheets

TESTING INTEGRATED CIRCUIT DESIGNS ON A COMPUTER SIMULATION USING MODIFIED SERIALIZED SCAN PATTERNS

This continuation of application Ser. No. 08/176,382, filed Jan. 3, 1994, now U.S. Pat. No. 5,574,853.

TECHNICAL FIELD OF THE INVENTION

This invention relates generally to testing integrated circuit designs, and more particularly to testing integrated circuit designs on a computer simulation using modified serialized scan patterns.

BACKGROUND OF THE INVENTION

The design, testing, and fabrication of an integrated circuit (IC) is a complicated and expensive process. One goal of IC manufacturers and designers is to shorten the cycle time between design and fabrication to allow quick introduction of new ICs and quick production of application specific ICs (ASICs). To accomplish this goal in the most cost effective manner, chip designers and manufacturers rigorously test the IC design on computer simulations before fabrication. An effective testing program that verifies the IC design before fabrication returns dividends in lower production costs and higher chip yields.

The process to produce a new IC begins with a design, often performed with the aid of computer-aided design and manufacturing (CAD/CAM) technology. To verify the designs an automatic test pattern generator (ATPG) or other appropriate technology generates a set of test patterns that relate the external functionality of the IC to its internal state. The test patterns from the ATPG are loaded in parallel into various registers and components on a computer simulation of the IC to verify the function of the signal lines, combinatorial logic, registers, counters, and other IC elements and how they relate to the overall operation of the IC.

Once an IC has been manufactured, parallel loading of the test patterns into the IC is impossible. Thus, designs often incorporate testing circuitry, such as a scan chains that allows automated testing equipment (ATE) to scan in or serially load test patterns into internal registers or elements of the fabricated IC. Just as with the computer simulation, these test patterns set the IC to a known state. External inputs are then applied to the IC, and the scan chain allows the ATE to scan out or serially unload the resulting IC state for comparison with an expected state. The ATE serialized scan patterns may be generated from parallel ATPG test patterns. This parallel to serial conversion of test patterns is extremely important, and must take into account inversions and other logical manipulations along the scan chain to assure that the correct patterns are loaded for each test. If the conversion is done improperly or the original ATPG test patterns contain errors, flawless ICs may be rejected by the ATE because of an incorrect test pattern.

Therefore, from design to fabrication, an IC undergoes a variety of testing, including computer simulations using ATPG-generated test patterns and testing of the fabricated IC itself on an ATE using serialized scan patterns. Comprehensive testing of the IC design on a computer simulation or other testing tool before fabrication is relatively inexpensive, but often time consuming. The testing of the fabricated IC using serialized scan patterns validates the fabrication process, but can be expensive, especially when flaws in the IC design or serialized scan patterns were not discovered during computer simulation.

SUMMARY OF THE INVENTION

Accordingly, a need has arisen for a fast, accurate, and cost effective computer simulation that verifies both the IC design and the integrity of the serialized scan patterns relied on to test fabricated ICs. In accordance with the present invention, a computer simulation of the IC design using modified serialized scan patterns substantially eliminates or reduces the disadvantages and problems with prior art IC testing methods. The present invention tests the IC design on a computer simulation using modified serialized scan patterns that validate the functional and testing circuitry of the IC designs as well as the serialized scan patterns, in a fraction of the time of current IC testing methods.

In accordance with one aspect of the present invention, a method is disclosed to test an IC design on a computer simulation. The method generates a desired vector comprising state data to be loaded into a scan chain of the IC design. The scan chain is loaded in parallel with the state data of the desired vector. The state data is shifted a predetermined number of shifts along the scan chain to properly position the state data. As a result of loading and shifting the state data, the IC design is set to a desired state. The method concludes by executing a function of the IC design with the desired state.

In accordance with another aspect of the present invention, a process is disclosed for testing an IC. The process begins by generating serialized scan patterns for testing the fabricated IC. The serialized scan patterns contain state data to be loaded into a physical scan chain of the IC. Simulation test vectors for simulating the IC design on a computer simulation are generated from the serialized scan patterns. The IC design is simulated on a computer simulation by loading a simulated scan chain with the state data of the simulation test vectors using a parallel load followed by one or more shifts along the scan chain. After fabricating the IC, the process tests the fabricated IC by serially loading the physical scan chain with the state data of the serialized scan patterns.

It is a technical advantage of the present invention to test IC designs on a computer simulation in a fraction of the time of current IC testing methods. The testing time is reduced substantially by loading the scan chain in parallel with the modified serialized scan patterns and serially shifting the state data a few times through the scan chain to set the desired IC state.

It is another technical advantage of the present invention to use modified serialized scan patterns instead of parallel ATPG test patterns to simulate the functionality of the IC. The simulation verifies the IC design and also verifies the accuracy of the serialized scan patterns used by the ATE to test fabricated ICs. The present invention, therefore, offers a fast and accurate computer-based check of the serialized scan patterns before they are used to test fabricated ICs.

It is another technical advantage of the present invention to test IC designs using a computer simulation that does not require statements in the modified serialized scan patterns which indicate timing relationships between scan-in and scan-out data. The present invention, therefore, provides a general methodology to generate modified serialized scan patterns from serialized scan patterns or parallel test patterns independent of the packages used to generate the patterns and independent of scan chain architecture.

BRIEF DESCRIPTION OF THE DRAWINGS

For a more complete understanding of the present invention, and the advantages thereof, reference is now made to the following descriptions taken in conjunction with the accompanying drawings, and wherein.

DETAILED DESCRIPTION OF THE INVENTION

Figure 1:
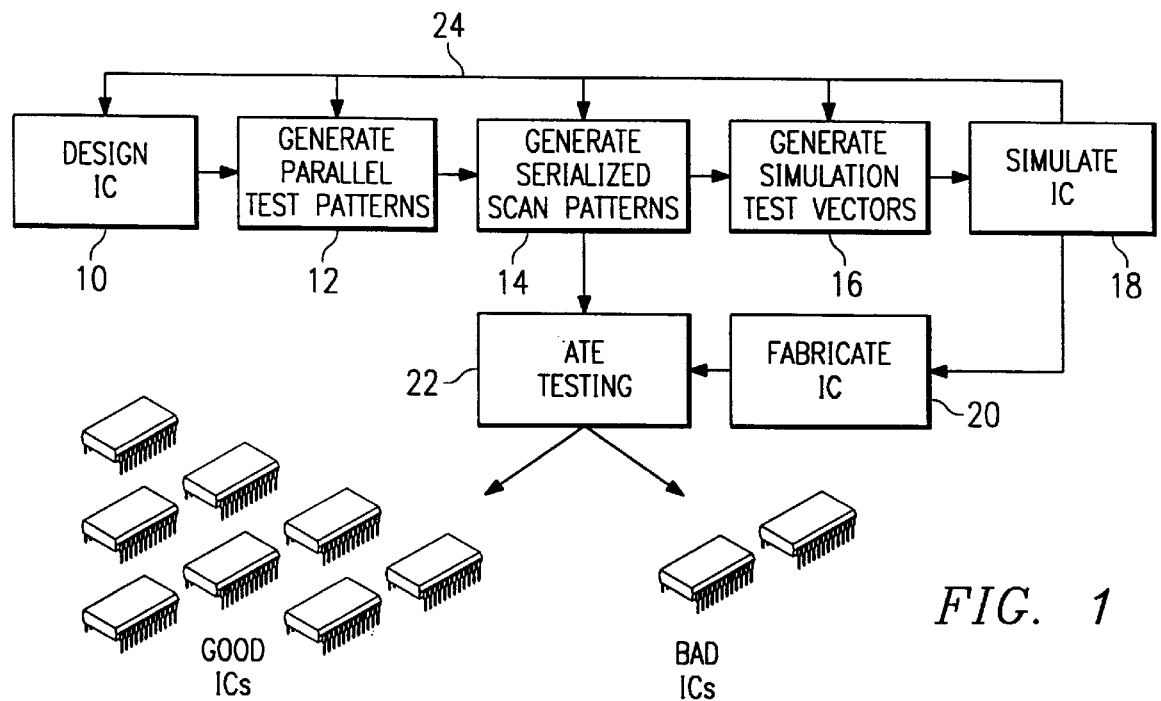
FIG. 1 is a flow diagram illustrating the steps to design, test, and fabricate an integrated circuit in accordance with the teachings of the present invention.

As shown in FIG. 1, the IC design, test, and fabrication process begins with the IC design at block 10 At block 12, parallel ATPG test patterns are generated to test the functionality of the IC design on a computer simulation. Using these parallel ATPG test patterns the process then generates serialized scan patterns at block 14, which will be used later on the ATE to test fabricated chips. Using the serialized scan patterns, the process then generates modified serialized scan patterns, termed simulation test vectors, at block 16 and simulates the IC design on a computer using these test vectors at block 18. Upon successful simulation, the process proceeds to fabrication of the IC at block 20 and testing of the fabricated IC on the ATE at block 22.

The IC design at block 10 begins with a detailed specification of the desired functionality of the IC. The designers may then produce a model of the IC on a CAD/CAM system. In one embodiment of the invention, the CAD/CAM model is used throughout the process to modify the design, test the design, and eventually fabricate the IC. An exemplary IC used for the purposes of this discussion includes external pins for input/output and various functional circuitry, including internal registers, flip-flops, latches, clocks, combinatorial logic signal lines, and any other suitable internal elements. The functional circuitry of the exemplary IC performs IC functions, whereas the testing circuitry, such as a scan chain, allows loading and unloading of the internal elements for testing of the fabricated IC.

It should be understood that the invention applies to individual integrated circuits as well as an arrangement of integrated circuits and other support circuitry on an integrated circuit board. For example, an integrated circuit board may have several components connected by a scan chain that allows loading and unloading of the internal elements of the several circuit board components for testing.

An ATPG system preferably adapted to receive the CAD/CAM model of the IC, generates parallel test patterns at block 12 that define and map the functionality of the IC through data sets. In one embodiment, the parallel test patterns are produced in vector pairs, the first vector representing the desired initial IC state and the second vector representing the final target IC state after performing an IC function. In addition, a parallel test pattern may include the external pin input vector and a desired or target external pin output vector after executing the IC function.

For purposes of this discussion, the IC state represents the collection of individual states of some or all of the internal elements of the IC capable of storing data. For example, if an IC design contains 4,000 internal registers, where each register holds a single bit of data, then a 4,000 bit vector specifying the data stored in each individual register may be used to define the IC state. For full scan architecture ICs, where the scan chain includes all of the internal elements capable of storing data, the IC state comprises the state of all of these internal elements. The IC state for partial scan architecture ICs comprises the state of selected internal elements. The present invention contemplates both full and partial scan architecture ICs.

The ATPG test patterns are parallel since they directly specify the IC state without adjustments for serial loading or unloading. For example, if the IC state is loaded serially, the initial test pattern may have to account for inversions and other logical manipulations along the scan chain as the data is shifted into place. As discussed below, serialized scan patterns and modified serialized scan patterns account for these inversions and other logical manipulations along the scan chain.

The testing of an IC design on a computer simulation using parallel ATPG test patterns proceeds as follows. The simulation sets some or all of the individual states of internal elements by loading in parallel a desired initial IC state generated by the ATPG. The simulation then simulates a functional operation of the IC by providing a simulated input vector to the external pins of the IC design and receiving a simulated output vector from the external pins. In the course of simulating normal operation, the IC state changes. The simulation completes the testing by comparing the new IC state to a desired or target IC state generated by the ATPG. Since the IC design is simulated, the computer simulation has access to internal elements and can load and unload the scan chain in parallel.

In addition to generating parallel ATPG test patterns, a typical design process also generates serialized scan patterns at block 14 to run on the ATE at block 22 to test fabricated ICs. Unlike parallel ATPG test patterns, the ATE scan patterns must be serialized since the ATE cannot load the scan chain in parallel when testing a fabricated IC. As discussed above the exemplary IC used for purposes of this discussion, shown in more detail in FIG. 3, contains separate testing circuitry connecting some or all of the internal elements along a serial data line. The serial data line with connected internal elements is referred to collectively as a scan chain. The scan chain allows data to be loaded or unloaded serially in order to set or read the IC state. For example, for a one bit wide scan chain containing 4,000 registers, a 4,000 bit serialized scan pattern would be used to serially load all 4,000 individual registers.

The step of generating serialized scan patterns at block 14 accounts for inversions and other logical manipulations along the scan chain. in the example above, after shifting the 4,000 bit serialized scan pattern into the fabricated IC, the IC state should correspond with the desired state specified in a corresponding parallel ATPG test pattern. Therefore, a parallel test pattern can be converted into a serialized scan pattern by accounting fQr scan chain logic.

At block 16, the IC design, test, and fabrication process of the present invention generates modified serialized scan patterns, called simulation test vectors, directly from the serialized scan patterns or from the ATPG parallel test patterns. The process to modify serialized scan patterns, like the process to generate serialized scan patterns from parallel test patterns, takes into account scan chain logic.

One technical advantage of the present invention is that the simulation test vectors used to test the IC design can be generated directly from the serialized scan patterns run on the ATE. Therefore, the computer simulation of the IC design at block 18 verifies both the functionality of the IC design and the integrity of the ATE serialized scan patterns. This is an important aspect of the present invention since an error in the ATE serialized scan patterns may result in the improper rejection of good ICs. By discovering any errors in the IC design or serialized scan patterns before fabrication, the design process illustrated in FIG. 1 maximizes chip yield and substantially reduces design and fabrication costs.

The computer simulation of the IC design using the simulation test vectors, shown functionally at block 18, involves comprehensive 3σ a voltage, temperature, and process CVTP) testing. The simulator may be a special purpose computer or hardware accelerator designed particularly for simulation of IC designs, such as those manufactured by IKOS. Alternatively the simulator may be any general purpose computer running appropriate simulation software, such as the CAD/CAM software package designed by Cadence. The present invention contemplates any suitable hardware and software to accomplish the task of simulating the IC design.

One technical advantage of the present invention, is that the simulation shown at block 18 both tests the functional and testing circuitry of the IC design and verifies the serialized scan patterns in an integrated test package at a fraction of the time of other comparable testing systems. Fast and comprehensive testing of all aspects of the IC design is important for fast cycle environments, and in particular ASIC development, where quick turnaround of new IC designs is critical.

The IC simulation shown functionally at block 18 uncovers previous errors generated at blocks 10–16 of the design process. The simulation at block 18 can pinpoint design and serialized scan pattern errors and initiate a re-design shown functionally by feedback loops 24. One technical advantage of the present invention is the early detection of errors before the fabrication and ATE testing phase. The 3σ VTP simulation at block 18 is discussed in more detail with reference to FIGS. 2–4.

After performing a successful computer simulation of the IC design using the simulation test vectors, the IC is fabricated at block 20 using fabrication techniques well known in the art. The fabrication may be based on the CAD/CAM model used throughout the design and testing phase of the IC. At block 22, the ATE tests fabricated ICs with the serialized scan patterns generated at block 14 and verified by the simulation at block 18.

Figure 2:
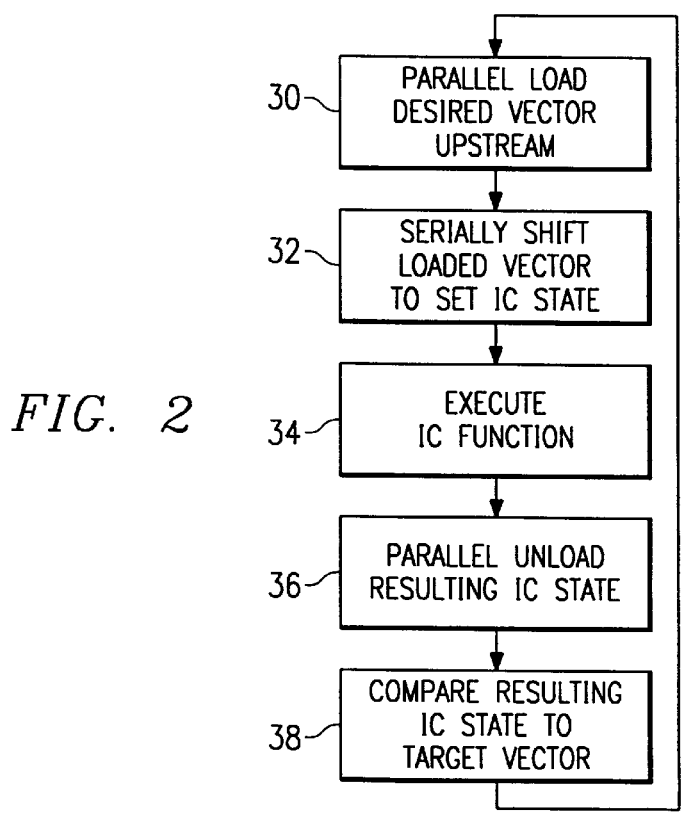
FIG. 2 is a flow diagram illustrating the steps to test an integrated circuit on a computer simulation using modified serialized scan patterns in accordance with the teachings of the present invention.

FIG. 2 shows in detail the simulation steps performed at block 18, including a hybrid parallel/serial load of the desired simulation test vector. At block 30, the simulation loads a desired simulation test vector in parallel into the scan chain. The simulation loads the desired vector in parallel at a slight upstream offset, and then shifts the loaded vector through the scan chain, as shown at block 32. After the serial shifts the initial IC state is set for executing an IC function at block 34. The IC function includes applying an input on the external pins and receiving an output from the external pins, given the initial IC state loaded by the simulation. After executing the IC function, the simulation unloads the resulting IC state in parallel at block 36 and compares the resulting IC state to a target vector at block 38. The process repeats for additional simulation test vectors.

The steps of FIG. 2 test both the functional and testing circuitry of the IC design. The parallel load of the desired vector and the sequence of serial shifts to set an initial IC state tests the controllability of the IC design. Controllability refers to the process of setting the state of internal elements to test various IC functions. Controllability testing verifies IC testing circuitry and assures that the ATE can properly set the IC state during fabrication testing. The simulation of input and output vectors on the external IC pins, in connection with a given IC state, tests the IC functional circuitry. Finally, the parallel unload of the resulting IC state tests the observability of the IC design. observability verifies the operation of the IC and confirms the proper resulting IC state after executing an IC function.

The desired vector is loaded upstream to allow several serial shifts of the loaded vector through the scan chain at block 32 to set the initial IC state. For example, to accomplish three shifts at block 32, the desired vector is loaded in parallel into the scan chain three shifts upstream of its desired state. The data is serially shifted enough times at block 32 to verify that the IC testing circuitry can properly load serial data for testing on the ATE. The serial shifts confirm the proper data path through the scan chain and also detect any timing delays along the scan chain resulting from lengthy connections between internal IC elements It should be understood that the specified number of serial shifts performed at block 32 depends on scan chain architecture.

One technical advantage of the present invention is that performing a hybrid parallel/serial load of the IC in simulation drastically reduces the simulation time while verifying the IC testing circuitry. A purely serial load validates the scan chain operation, but often requires thousands of shifts to load the initial IC state. For examples serial loading of a 4,000 bit vector along a one bit scan chain requires 4,000 separate register shifts to set the initial IC state. In prior art systems, testing an IC design on a computer simulation using serial loading could take days.

Likewise, a purely parallel load sets the initial IC state in one step, but does not validate the design of the IC testing circuitry. Parallel loading and unloading of the IC state does not exercise the serial operation of the scan chain, both in its connections and potential timing problems. Furthermore, parallel loading does not simulate the effect of scan chain logic on serially shifted data, which is an important step in verifying the serialized scan patterns. Therefore, the simulation steps of FIG. 2 combine the time savings of a parallel load at block 30 and the scan chain evaluative benefits of a few serial shifts at block 32.

After the desired vector is parallel loaded and serially shifted into place to set the initial IC state, the simulation performs an IC function at block 34. The IC function testing may employ one or more pairs of external pin input vectors and external pin target output vectors to evaluate the functional circuitry of the IC design. For example, after the initial IC state is set using a hybrid parallel/serial load, the simulation applies an input vector to a selected number of external pins on the IC design. After a specified time, the simulation reads the resulting output vector on a selected number of external pins and compares this output to a target output vector.

In addition to testing the combinatorial logic and other internal data manipulations performed by the IC functional circuitry, the simulation step at block 34 also detects potential timing problems in the IC design. For examples if the IC design includes a long signal path between designated input and output pins, the simulation can detect this potential problem at block 34 by sampling the output pins at the expected processing interval of the IC design to determine whether the output has settled. The simulation may detect such a timing delay problem if the signal on the output pins continues to change beyond the expected processing interval of the IC design.

After performing one or more IC functions, the simulation proceeds to unload the resulting IC state in parallel at block 36 and to compare the resulting IC state to the target vector at block 38. Again, since the computer simulation can access the scan chain in parallels the simulation can directly observe both the resulting IC state and the external pins. This observability of the functional and testing circuitry is important to verify the integrity of the IC design.

The IC design may contain several different types of internal elements that store and process data differently. For examples a simple flip-flop may unload stored data and load a new piece of data in response to a single clock cycle. However, a multiple phase latch, a counter, or other internal elements may require two or more clock cycles to perform a processing function. Therefore, the simulation may need to execute one or more clock cycles to shift data through the various internal elements of the scan chain. Before unloading the resulting IC state in parallel at block 36, the simulation may serially shift the data through the scan chain one or more times to prepare it for a parallel unload. This additional step may be necessary to give the simulation better observability of the resulting IC state.

In summary, the simulation process of FIG. 2 includes a parallel load of the desired vector, a number of serial shifts to set the initial IC state, execution of one or more IC functions, an optional number of serial shifts to improve observability, and a parallel unload of the resulting IC state for comparison to a target vector. In one embodiment of the present invention, the desired vector and target vector generated for the simulation are independent of the operation of IC registers, counters, and other internal elements. In such a manner, a designer may specify desired and target vectors and the number of serial scan-in and scan-out shifts without specifying timing relationships, setting simulation flags, or requiring some other type of special format test pattern. Therefore, by using simulation test vectors generated from serialized scan patterns, and by not reguiring specific instructions or other timing considerations in the simulation test vectors, the simulation process of FIG. 2 provides a standardized, cost effective, and very fast verification of an IC design and its associated serialized scan patterns to be used during fabrication testing.

Figures 3, 4:
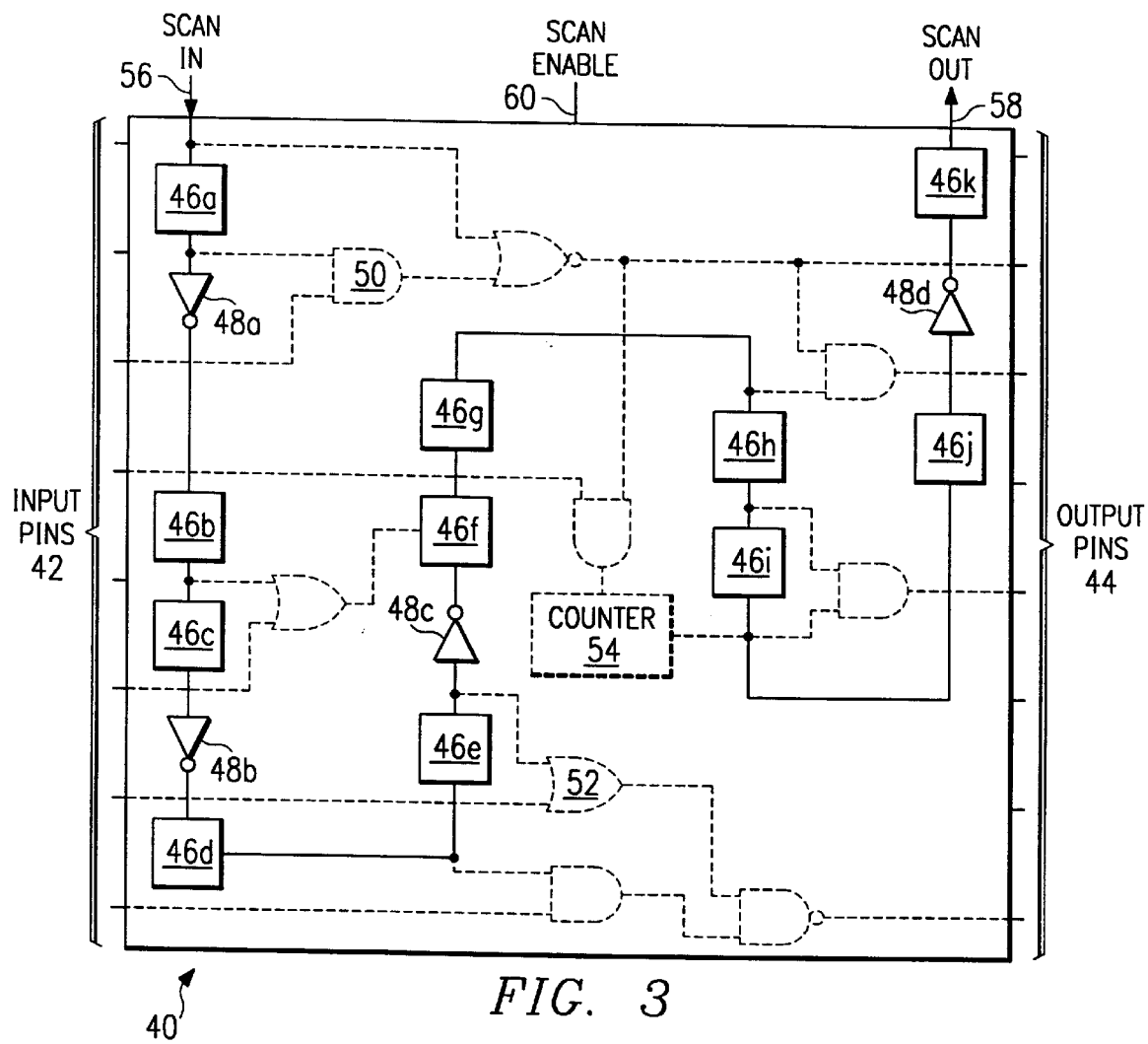
FIG. 3 is block diagram of a simplified integrated circuit illustrating the operation of a scan chain during a computer simulation in accordance with the teachings of the present invention.
FIG. 4 illustrates the modification of a simulation test pattern serially shifted through a scan chain in accordance with the teachings of the present invention.

FIG. 3 is a simplified block diagram of an IC 40 containing input pins 42 and output pins 44. For clarity, the IC testing circuitry, including the internal scan chain elements and connections, is shown in solid lines and the functional circuitry is shown in dashed lines. Registers 46a–46k and inverters 48a–48d are shown in solid lines but are part of and integral to both the testing and functional circuitry of IC 40. The functional circuitry shown in dashed lines includes combinatorial logic such as AND gate 50, OR gate 52, and counter 54, among others. The functional circuitry shown in FIG. 3 does not purport to perform any particular IC function, but is intended to illustrate generally the relationship between the testing and functional circuitry of IC 40. It should be understood that the present invention contemplates combinations of any testing and functional circuitry within IC 40.

IC 40 contains scan-in pin 56 connected to the input of register 46a in the scan chain. Scan-out pin 58 connects to the output of register 46k in the scan chain. Scan enable pin 60 allows selection of the functional or testing mode of IC 40. During testing modes testing circuitry is enabled and the scan chain can be loaded serially using scan-in pin 56 and unloaded serially using scan-out pin 58. In functional modes testing circuitry is disabled and the functional circuitry shown in dashed lines is enabled, along with registers 46a–46k and other internal elements of the scan chain.

IC 40 processes input data received on input pins 42 and outputs the result of the data processing on output pins 44. It is understood that the present invention contemplates any number and combination of input pins 42, output pins 44, and other chip control pins, such as scan-in pin 56, scan-out pin 58, and scan enable pin 60. If the scan chain is wider than one bit, IC 40 may contain multiple scan-in pins 56 and multiple scan-out pins 58. Furthermore, input pins 42 and output pins 44 are shown in FIG. 3 as two separate sets of pins, but the present invention contemplates shared input and output pins to both input data to and receive data from IC 40.

The scan chain, illustrated in solid lines in FIG. 3, contains eleven registers (46a–46k) and four inverters (48a–48d) connected along a serial data line. An exemplary IC design used in industry may contain 4,000 or more registers in a single scan chain, along with a combination of inverters, logical components, or other internal elements disposed between the registers. Furthermore, IC 40 may contain multiple scan chains or scan chains more than one bit wide. In general, a scan chain constructed in accordance with the present invention allows the ATE to set the IC state by serially scanning in data and to read the IC state by serially scanning out data.

For purposes of this discussion, registers 46a–46k are single cycle storage devices. Therefore, for each clock cycle, registers 46a–46k transfer the data on their input line to an asserted signal on their output line. However, the present invention contemplates use of different types of internal elements that may store one or more intermediate pieces of data. For example, a master/slave flip-flop may require two clock cycles to propagate a signal from its input lead to its output lead. Therefore, registers 46a–46k represent any type of flip-flop, register, or other internal elements of the scan chain that are capable of storing data. Inverters 48a–48d output the inverse of the signal on their input lead and may also act as a storage register.

FIG. 3 represents both the fabricated IC and the IC design running on a computer simulation. To test a fabricated IC, the ATE must serially input the desired IC state on scan-in pin 56 and serially output the resulting IC state on scan-out pin 58. However, a computer simulation of the design of IC 40 has access to the internal state of IC 40 and can load and unload the scan chain in parallel.

The following discussion applies the simulation steps of FIG. 2 to the IC design in FIG. 3 running on a computer simulation. At block 30, the simulation loads the desired vector in parallel, but upstream of its final destination. For example, to load a desired vector three shifts upstream from its intended state, the simulation loads in parallel registers 46a–46h with the last eight bits of an eleven bit desired vector. At block 32, the simulation serially shifts the loaded data three times through the scan chain to fill registers 46a–46k with the proper state values. This serial shifts require three additional bits of data, one for each of the three shifts, to be input on scan-in pin 56.

FIG. 4 demonstrates the effect of inverters 48a–48d on a desired vector loaded three shifts upstream and then serially shifted into place. The desired state of IC 40 after the hybrid parallel/serial load is a "1" in registers 46a–46k. The first row in FIG. 4 represents the desired vector that, if loaded in parallel into registers 46a–46h and serially shifted three times, would properly set the desired state of IC 40. In an IC design with 4,000 registers, and using the same example of three serial shifts, the simulation loads in parallel 3,997 out of the 4,000 registers. Thus, it can be seen that the present invention performs the majority of the loading process in parallel, thereby substantially reducing the time and processing to set the initial IC state before testing its functionality.

Row two of FIG. 4 shows the resulting state of each register after a first shift along the scan chain, including the effect of inverters 48a–48d. The second shift fills all registers except 46k and the third shift places IC 40 in the desired state with a "1" in registers 46a–46k.

The serial portion of the loading described above includes three shifts, but it is understood that any number of shifts may be used while setting the state of IC 40. The serial shift verifies the testing circuitry design, and assures that the ATE can set the proper state while testing fabricated ICs. In particular, the serial shifts verify the proper connection and operation of registers 46a–46k and the effect on the loaded data of inverters 48a–48d and other logic components along the scan chain.

Referring again to FIG. 3, the serial shift also detects timing problems in the scan chain, such as a long delay path between two registers. For example, a signal passed from the output of register 46i to the input of register 46j may not be able to traverse the long signal path between the two registers before the next clock cycle. If the simulation loads the desired vector in parallel into registers 46a–46k in one step, then the simulation does not exercise the scan chain and cannot detect scan chain timing delays or other errors in the testing circuitry.

After setting the state of IC 40 using the hybrid parallel/ serial loading operation, the simulation executes an IC function. The simulation applies an input vector on input pins 42 and receives an output vector on output pins 44. The output vector is a function of the input vector, the IC state represented by data stored in registers 46a–46k, the combinatorial logic, and any other functional circuitry internal to IC 40. The simulation verifies that the data on output pins 44 corresponds to the target output vector.

The simulation then unloads the resulting IC state in parallel, as shown at block 36 of FIG. 2 To achieve maximum observability of different types of internal elements the simulation may also perform one or more serial shifts along the scan chain to prepare IC 40 for parallel unloading. At block 38 of FIG. 2 the simulation compares the resulting IC state to a target vector. The process of FIG. 2 as applied to the IC design in FIG. 3 repeats for additional simulation test vector sets.

There have been described certain embodiments of a method of testing an IC design on a computer simulation using a hybrid parallel/serial load to verify the functional and testing circuitry of the IC design and to validate the serialized scan patterns generated for an ATE. While these embodiments have been described and disclosed, other changes, substitutions, or alterations can be made without departing from the spirit and scope of the present invention, as described in the appended claims.

What is claimed is:

1. A method to test an integrated circuit design on a computer simulation, comprising the steps of:
   generating a desired vector having state data to be loaded into a scan chain of the integrated circuit design;
   loading the scan chain with the state data of the desired vector in parallel to form a parallel scan chain of the integrated circuit design and the parallel scan chain with the state data being offset by a predetermined number of shifts;
   serially shifting the state data by the predetermined number of shifts along the scan chain to position the state data in the scan chain, to set a desired state of the integrated circuit design prior to executing a function of the integrated circuit design; and,
   executing said function of the integrated circuit design with the desired state.

2. The method of claim 1, and further comprising the steps of:
   unloading in parallel a resulting state of the integrated circuit design from the execution, the resulting state of the integrated circuit design having the state data in the scan chain after executing the function; and
   comparing the resulting state of the integrated circuit design to a predetermined target vector.

3. The method of claim 1, and further comprising the steps of:
   shifting a resulting state of the integrated circuit design along the scan chain from the execution, the resulting state of the integrated circuit design having the state data in the scan chain after executing the function;
   unloading in parallel the resulting state; and
   comparing the resulting state of the integrated circuit design to a predetermined target vector.

4. The method of claim 1, wherein the step of shifting includes the step of validating the operation of the scan chain.

5. The method of claim 1, wherein the step of executing a function further comprises:
   applying an input vector to the integrated circuit design; and
   reading an output vector from the integrated circuit design after a predetermined amount of time.

6. The method of claim 1, wherein the step of generating a desired vector further including generating the desired vector from serialized scan patterns used in testing the fabricated integrated circuit.

7. The method of claim 1, wherein the step of generating a desired vector further comprises the steps of:
   generating a parallel test pattern on an automatic test pattern generator;
   generating, using the parallel test pattern, a serialized scan pattern for testing the fabricated integrated circuit; and
   generating, using the serialized scan pattern, the desired vector for testing the integrated circuit design on the computer simulation.

8. A method to test an integrated circuit board design on a computer simulation, the integrated circuit board design comprising a plurality of integrated circuit components, comprising the steps of:
   generating a desired vector having state data to be loaded into a scan chain associated with the integrated circuit components;
   loading the scan chain with the state data of the desired vector in parallel to form a parallel scan chain and the parallel scan chain of the desired vector being offset by a predetermined number of shifts;
   serially shifting the state data the predetermined number of shifts along the parallel scan chain to position the state data in the scan chain, to set a desired state of the integrated circuit board design before execution of a function of the integrated circuit board design; and
   executing the function of the integrated circuit board design with the desired state.

9. The method of claim 8, and further comprising the steps of:
   unloading in parallel a resulting state of the integrated circuit board design from the execution, the resulting state of the integrated circuit board design comprising the state data in the scan chain after executing the function; and comparing the resulting state of the integrated circuit board design to a predetermined target vector.

10. The method of claim 8, and further comprising the steps of:

shifting a resulting state of the integrated circuit board design along the scan chain, the resulting state of the integrated circuit board design including the state data in the scan chain after executing the function;

unloading in parallel the resulting state; and comparing the resulting state of the integrated circuit board design to a predetermined target vector.

11. The method of claim 8, wherein the step of shifting includes the step of validating the operation of the scan chain.

* * * * *